United States Patent
Freitag et al.

(10) Patent No.: US 7,145,755 B2
(45) Date of Patent: Dec. 5, 2006

(54) SPIN VALVE SENSOR HAVING ONE OF TWO AP PINNED LAYERS MADE OF COBALT

(75) Inventors: James Mac Freitag, San Jose, CA (US); Mustafa Michael Pinarbasi, Morgan Hill, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 420 days.

(21) Appl. No.: 10/675,782

(22) Filed: Sep. 30, 2003

(65) Prior Publication Data

US 2005/0068692 A1    Mar. 31, 2005

(51) Int. Cl.
G11B 5/39        (2006.01)
(52) U.S. Cl. .................................... 360/324.11
(58) Field of Classification Search ............ 360/324.11
See application file for complete search history.

(56) References Cited

U.S. PATENT DOCUMENTS

| | | | |
|---|---|---|---|
| 5,432,734 A | 7/1995 | Kawano et al. | |
| 5,701,223 A | 12/1997 | Fontana et al. | |
| 5,880,913 A | 3/1999 | Gill | |
| 6,134,090 A | 10/2000 | Mao et al. | |
| 6,226,159 B1 | 5/2001 | Pinarbasi | |
| 6,282,068 B1 | 8/2001 | Pinarbasi | |
| 6,338,899 B1 * | 1/2002 | Fukuzawa et al. ..... | 360/324.12 |
| 6,348,274 B1 | 2/2002 | Kamiguchi et al. | |
| 6,353,519 B1 | 3/2002 | Pinarbasi | |
| 6,356,419 B1 | 3/2002 | Gill | |
| 6,495,275 B1 | 12/2002 | Kamiguchi et al. | |
| 6,535,362 B1 | 3/2003 | Kawawake et al. | |
| 6,905,780 B1 * | 6/2005 | Yuasa et al. ................ | 428/611 |
| 2001/0040781 A1 | 11/2001 | Tanaka et al. | |
| 2002/0085322 A1 | 7/2002 | Pinarbasi | |
| 2002/0181173 A1 | 12/2002 | Nagai | |
| 2003/0035255 A1 | 2/2003 | Hasegawa et al. | |

FOREIGN PATENT DOCUMENTS

WO    WO 02/077657    10/2002

OTHER PUBLICATIONS

Egelhoff Jr. et al., Oxygen as a Surfactant in the Growth of Gant Magnetoresistance Spin Valves, Journal of Applied Physics, Dec. 15, 1997, 6142-6151, 82-12.
Sakakima et al., Enhanced GMR in PtMn-Based Spin Valves with Specular Reflective Thin Oxide Layers, IEEE Transactions on Magnetics, Sep. 2000, 2554-2556, 36-5, Kyoto, Japan.
Wang et al., Specularity in GMR Spin Valves and In Situ Electrical and Mangetotransport Measurements, IEEE Transactions on Magnetics, Sep. 2000, 2841-2846, 36-5, Kyoto, Japan.

* cited by examiner

Primary Examiner—A. J. Heinz
(74) Attorney, Agent, or Firm—John J. Oskorep, Esq.; Matthew Zises (57) ABSTRACT

In one illustrative example of the invention, a spin valve sensor includes a free layer structure; an antiparallel (AP) pinned layer structure; and a non-magnetic electrically conductive spacer layer in between the free layer structure and the AP pinned layer structure. The AP pinned layer structure includes a first AP pinned layer; a second AP pinned layer; and an antiparallel coupling (APC) layer formed between the first and the second AP pinned layer. One of the first and the second AP pinned layers consists of cobalt and the other one includes cobalt-iron. The pure cobalt may be provided in the first AP pinned layer or the second AP pinned layer. Advantageously, the use of cobalt in one of the AP pinned layers increases the $\Delta r/R$ of the spin valve sensor.

21 Claims, 12 Drawing Sheets

FIG. 9
(ABS)

SPIN VALVE SENSOR HAVING ONE OF TWO AP PINNED LAYERS MADE OF COBALT

BACKGROUND OF THE INVENTION

1. Field of the Invention

This invention relates generally to spin valve sensors of magnetic heads, and more particularly to the use of cobalt in one of the antiparallel (AP) pinned layers of an AP pinned layer structure.

2. Description of the Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read (MR) sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which the MR element resistance varies as the square of the cosine of the angle between the magnetization of the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g., nickel-iron, cobalt-iron, or nickel-iron-cobalt) separated by a layer of nonmagnetic material (e.g., copper) are generally referred to as spin valve (SV) sensors manifesting the SV effect. In an SV sensor, one of the ferromagnetic layers, referred to as the pinned layer, has its magnetization typically pinned by exchange coupling with an antiferromagnetic (AFM) layer (e.g., nickel-oxide, iron-manganese, or platinum-manganese) layer. The pinning field generated by the AFM layer should be greater than demagnetizing fields to ensure that the magnetization direction of the pinned layer remains fixed during application of external fields (e.g. fields from bits recorded on the disk). The magnetization of the other ferromagnetic layer, referred to as the free layer, however, is not fixed and is free to rotate in response to the field from the information recorded on the magnetic medium (the signal field). A cap or capping layer of tantalum is typically formed over the sensor stack structure for protecting the sensor during and after its production.

There are several properties of a spin valve sensor which, if improved, will improve the performance of the magnetic head and increase the data storage capacity of a disk drive. For example, it is generally desirable to increase the magnetoresistive coefficient $\Delta r/R$ and decrease the coercivity $H_c$ of the free layer without substantially increasing the thickness of the sensor layers. An increase in the spin valve effect ($\Delta r/R$) equates to higher bit density (bits/square-inch of the rotating magnetic disk) read by read head. It is also desirable to keep the magnetostriction slightly negative or zero. If the free layers structure has positive magnetostriction and is subjected to compressive stress, there will be a stress-induced anisotropy that urges the magnetic moment of the free layer from a position parallel to the ABS toward a position perpendicular to the ABS. The result is undesirable read back asymmetry and instability. The compressive stress occurs after the magnetic head is lapped at the AMS to form the strip height of the sensor. After lapping, the free layer is in compression and this, in combination with positive magnetostriction, causes the aforementioned read back asymmetry. If the free layer structure has negative magnetostriction in combination with compressive stress that the magnetic moment of the free layer is actually strengthened along the position parallel to the ABS. Thus, it is desirable that the magnetostriction of the free layer be zero or only slightly negative.

Efforts continue to improve the properties of spin valve sensors. What are needed are ways in which to increase the magnetoresisitive coefficient $\Delta r/R$, lower the coercivity $H_c$, and substantially eliminate magnetostriction in a spin valve sensor.

SUMMARY

In one illustrative example of the invention, a spin valve sensor includes a free layer structure; an antiparallel (AP) pinned layer structure; and a non-magnetic electrically conductive spacer layer in between the free layer structure and the AP pinned layer structure. The AP pinned layer structure includes a first AP pinned layer; a second AP pinned layer; and an antiparallel coupling (APC) layer formed between the first and the second AP pinned layer. One of the first and the second AP pinned layers consists of cobalt and the other one includes cobalt-iron. The pure cobalt may be provided in the first AP pinned layer or the second AP pinned layer. Advantageously, the use of cobalt in one of the AP pinned layers increases the $\Delta r/R$ of the spin valve sensor.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figures 1, 2:
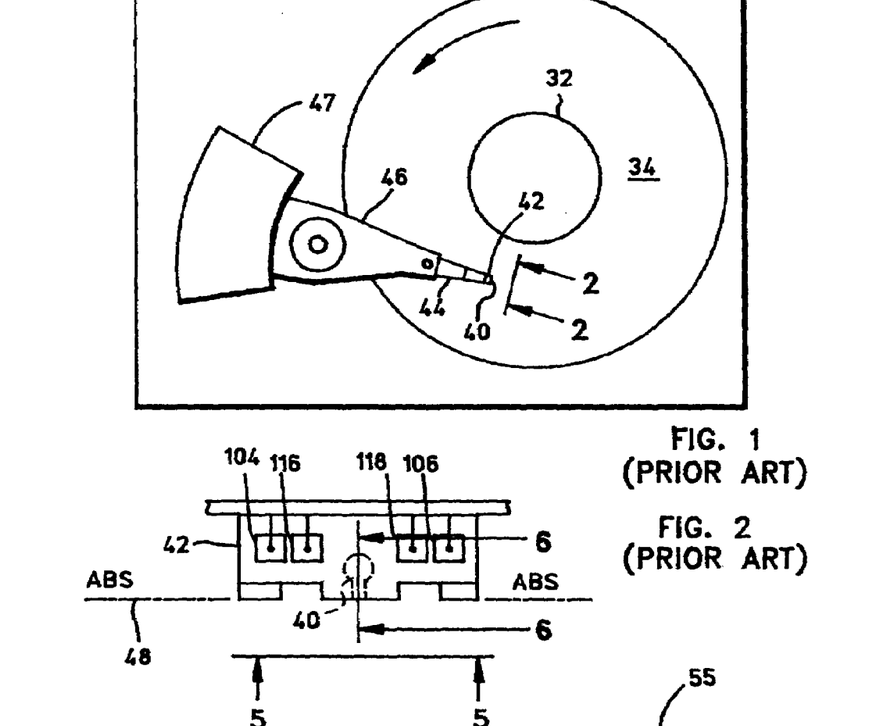
FIG. 1 is a plan view of an exemplary magnetic disk drive.
FIG. 2 is an end view of a slider with a magnetic head of the disk drive as seen in plane 2—2 of FIG. 1.
Figure 3:
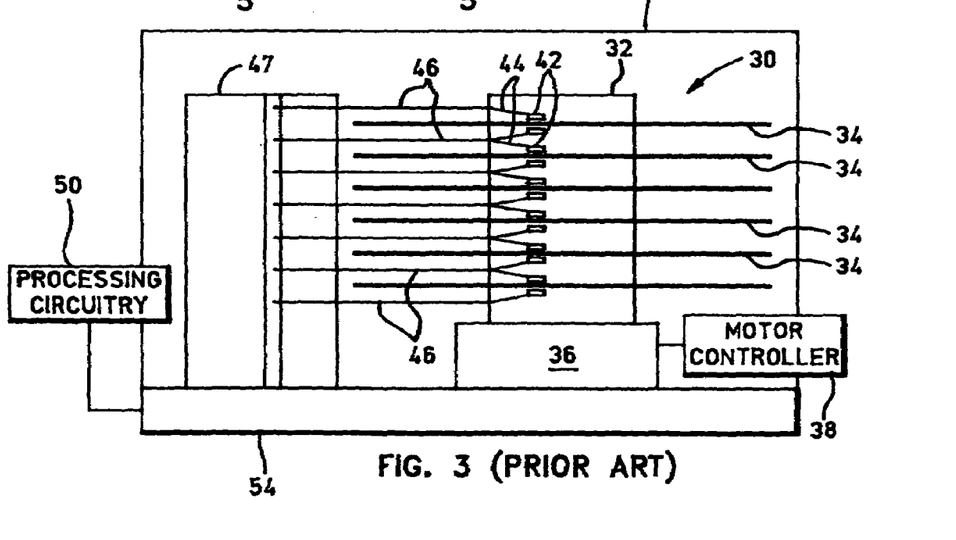
FIG. 3 is an elevation view of the magnetic disk drive wherein multiple disks and magnetic heads are employed.
Figure 4:
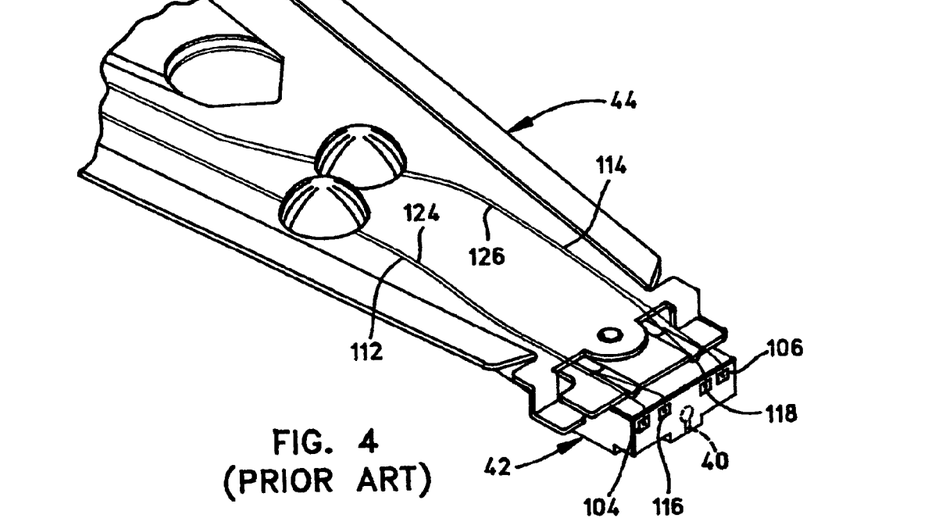
FIG. 4 is an isometric illustration of an exemplary suspension system for supporting the slider and magnetic head.
Figure 5:
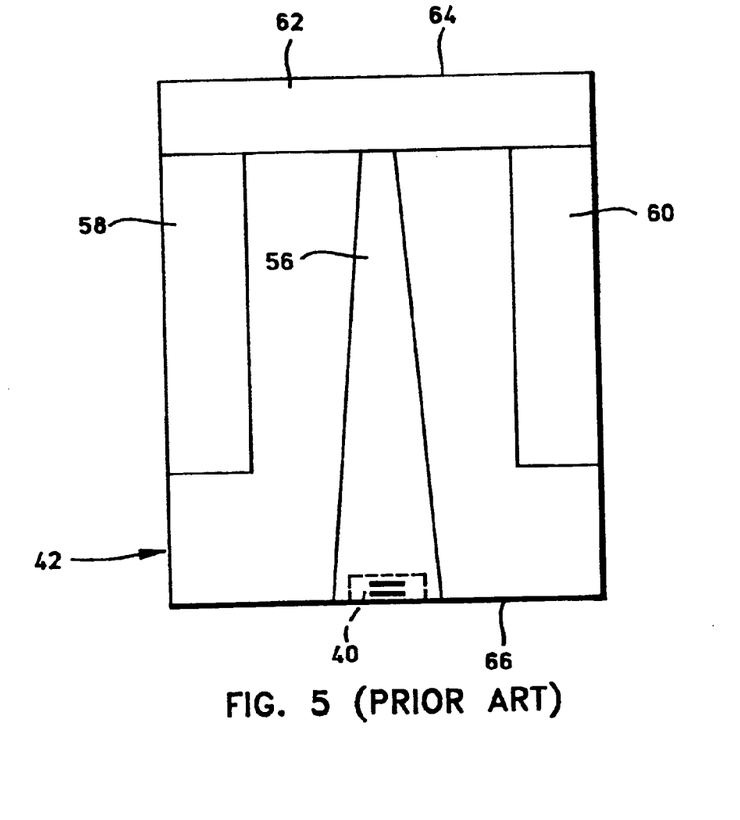
FIG. 5 is an air bearing surface (ABS) view of the magnetic head taken along plane 5—5 of FIG. 2.

Magnetic Disk Drive. Referring now to the drawings wherein like reference numerals designate like or similar parts throughout the several views, FIGS. 1–3 illustrate a magnetic disk drive 30. Disk drive 30 includes a spindle 32 that supports and rotates a magnetic disk 34. Spindle 32 is rotated by a spindle motor 36 that is controlled by a motor controller 38. A slider 42 includes a combined read and write magnetic head 40 and is supported by a suspension 44 and actuator arm 46 that is rotatably positioned by an actuator 47. A plurality of disks, sliders, and suspensions may be employed in a large capacity direct access storage device (DASD) as shown in FIG. 3. Suspension 44 and actuator arm 46 are moved by actuator 47 to position slider 42 so that magnetic head 40 is in a transducing relationship with a surface of magnetic disk 34. When disk 34 is rotated by spindle motor 36, slider 42 is supported on a thin (typically, 0.05 μm) cushion of air (air bearing) between the surface of disk 34 and an air bearing surface (ABS) 48. Magnetic head 40 may then be employed for writing information to multiple circular tracks on the surface of disk 34, as well as for reading information there from. Processing circuitry 50 exchanges signals, representing such information, with head 40, provides spindle motor drive signals for rotating magnetic disk 34, and provides control signals to actuator 47 for moving slider 42 to various tracks. In FIG. 4, slider 42 is shown mounted to a suspension 44. The components described hereinabove may be mounted on a frame 54 of a housing 55, as shown in FIG. 3. FIG. 5 is an ABS view of slider 42 and magnetic head 40. Slider 42 has a center rail 56 that supports magnetic head 40, and side rails 58 and 60. Rails 56, 58 and 60 extend from a cross rail 62. With respect to rotation of magnetic disk 34, cross rail 62 is at a leading edge 64 of slider 42 and magnetic head 40 is at a trailing edge 66 of slider 42.

Figure 6:
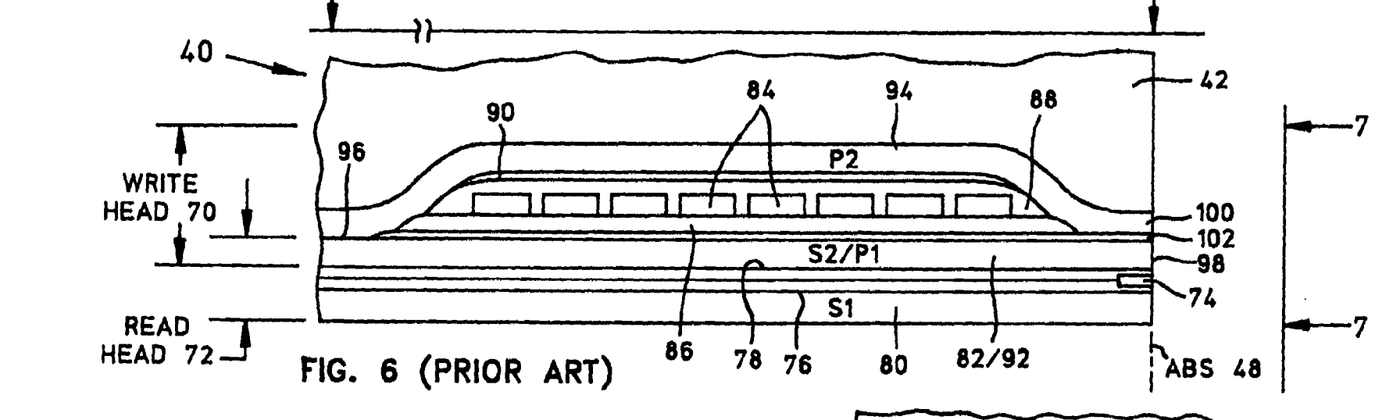
FIG. 6 is a partial view of the slider and a merged magnetic head as seen in plane 6—6 of FIG. 2.
Figure 7:
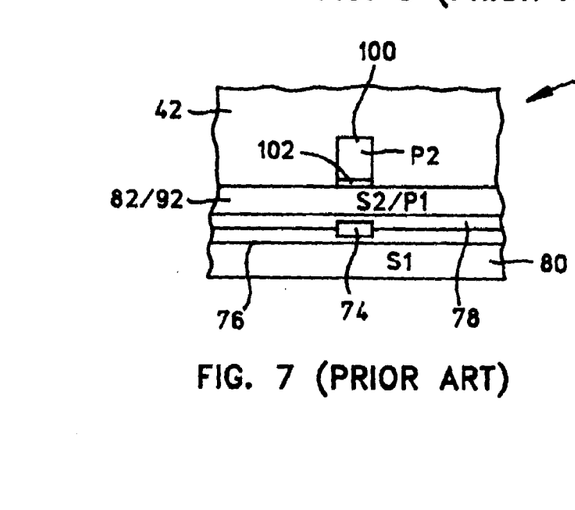
FIG. 7 is a partial ABS view of the slider taken along plane 7—7 of FIG. 6 to show the read and write elements of the merged magnetic head.

FIG. 6 is a side cross-sectional elevation view of a merged magnetic head 40, which includes a write head portion 70 and a read head portion 72. Read head portion 72 includes a giant magnetoresistive (GMR) read head which utilizes a spin valve sensor 74 of the present invention. FIG. 7 is an ABS view of FIG. 6. Spin valve sensor 74 is sandwiched between nonmagnetic electrically insulative first and second read gap layers 76 and 78, and read gap layers 76 and 78 are sandwiched between ferromagnetic first and second shield layers 80 and 82. In response to external magnetic fields, the resistance of spin valve sensor 74 changes. A sense current Is conducted through the sensor causes these resistance changes to be manifested as potential changes. These potential changes are then processed as read back signals by processing circuitry 50 shown in FIG. 3.

Figure 8:
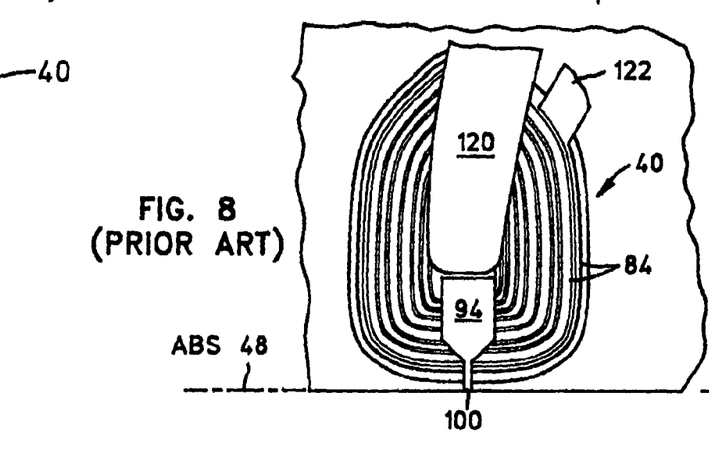
FIG. 8 is a view taken along plane 8—8 of FIG. 6 with all material above the coil layer and leads removed.

Write head portion 70 of magnetic head 40 includes a coil layer 84 sandwiched between first and second insulation layers 86 and 88. A third insulation layer 90 may be employed for planarizing the head to eliminate ripples in the second insulation layer caused by coil layer 84. The first, second and third insulation layers are referred to in the art as an "insulation stack". Coil layer 84 and first, second and third insulation layers 86, 88 and 90 are sandwiched between first and second pole piece layers 92 and 94. First and second pole piece layers 92 and 94 are magnetically coupled at a back gap 96 and have first and second pole tips 98 and 100 which are separated by a write gap layer 102 at the ABS. Since second shield layer 82 and first pole piece layer 92 are a common layer, this head is known as a merged head. In a piggyback head an insulation layer is located between a second shield layer and a first pole piece layer. As shown in FIGS. 2 and 4, first and second solder connections 104 and 106 connect leads from spin valve sensor 74 to leads 112 and 114 on suspension 44, and third and fourth solder connections 116 and 118 connect leads 120 and 122 from the coil 84 (see FIG. 8) to leads 124 and 126 on suspension 44.

Figure 9:
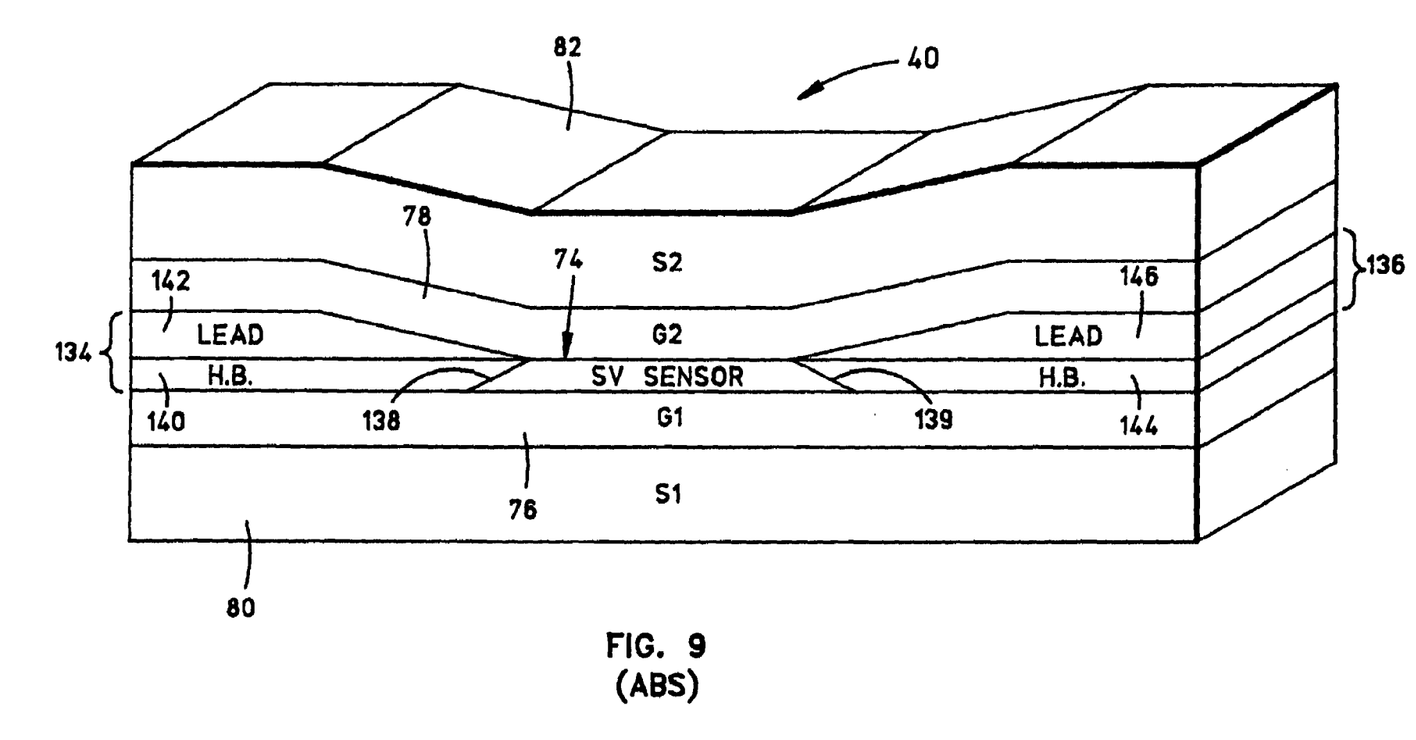
FIG. 9 is an enlarged isometric illustration of a read head having a spin valve sensor.

FIG. 9 is an enlarged isometric ABS illustration of read head 40 shown in FIG. 7 which includes spin valve sensor 74. First and second hard bias and lead layers 134 and 136 are connected to first and second side edges 138 and 139 of spin valve sensor 74. This connection is known in the art as a contiguous junction and is fully described in commonly assigned U.S. Pat. No. 5,018,037 which is incorporated by reference herein. First hard bias and lead layers 134 include a first hard bias layer 140 and a first lead layer 142, and second hard bias and lead layers 136 include a second hard bias layer 144 and a second lead layer 146. Hard bias layers 140 and 144 cause magnetic fields to extend longitudinally through spin valve sensor 74 for stabilizing the magnetic domains therein. Spin valve sensor 74 and first and second hard bias and lead layers 134 and 136 are located between the nonmagnetic electrically insulative first and second read gap layers 76 and 78. First and second read gap layers 76 and 78 are, in turn, located between ferromagnetic first and second shield layers 80 and 82.

Figure 10:
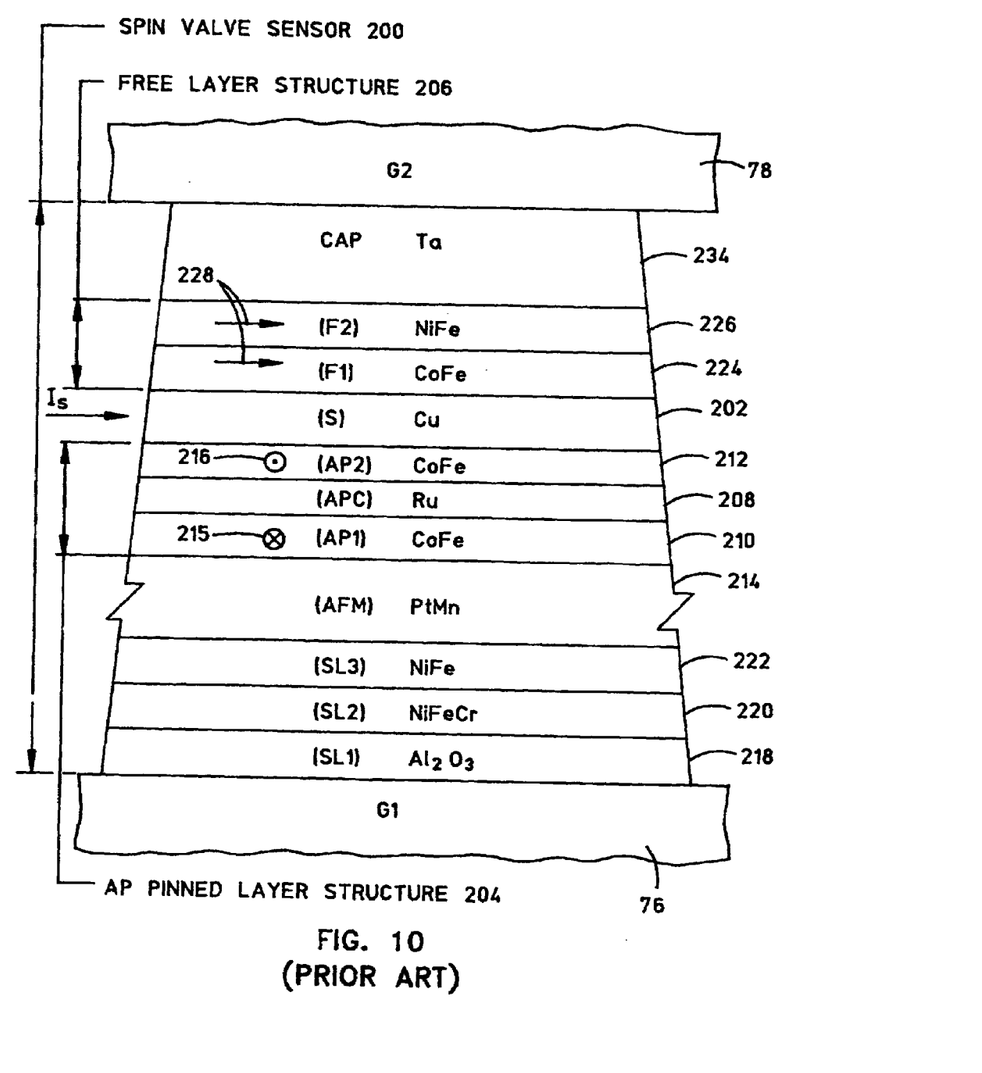
FIG. 10 is an ABS illustration of a typical multi-layer structure of a spin valve sensor.

FIG. 10 shows an ABS illustration of a typical multi-layered structure of a spin valve sensor 200 located between first and second read gap layers 76 and 78. Spin valve sensor 200 includes a non-magnetic electrically conductive spacer (S) layer 202 which is located between an antiparallel (AP) pinned layer structure 204 and a free layer structure 206. AP pinned layer structure 204 includes an antiparallel coupling (APC) layer 208 which is located between first and second ferromagnetic AP pinned layers (AP1) and (AP2) 210 and 212. First AP pinned layer 210 is exchange coupled to an antiferromagnetic (AFM) pinning layer 214 which pins a magnetic moment 215 of first AP pinned layer 210 perpendicular to the ABS in a direction out of or into sensor 200, as shown in FIG. 10. By strong antiparallel coupling between first and second AP pinned layers 210 and 212, a magnetic moment 216 of second AP pinned layer 212 is antiparallel to magnetic moment 215. First, second, and third seed layers (SL1), (SL2) and (SL3) 218, 220, and 222 may be provided between first read gap layer 76 and pinning layer 214 for promoting a desirable texture of the layers deposited thereon. Free layer structure 206 includes first and second free ferromagnetic layers (F1) and (F2) 224 and 226, with first free layer 224 interfacing spacer layer 202. Free layer structure 224 has a magnetic moment 228 which is oriented parallel to the ABS and to the major planes of the layers in a direction from right to left, or from left to right, as shown in FIG. 10. A cap or capping layer 234 is formed over free layer structure 206 for protecting the sensor.

When a signal field from the rotating magnetic disk rotates magnetic moment 228 into the sensor, magnetic moments 228 and 216 become more antiparallel which increases the resistance of the sensor to the sense current ($I_S$). When a signal field rotates magnetic moment 228 of free layer structure 206, magnetic moments 228 and 216 become more parallel which reduces the resistance of sensor 200 to the sense current ($I_S$). These resistance changes are processed as playback signals by processing circuitry (i.e. processing circuitry 50 of FIG. 3).

The following materials may be utilized in the multilayered spin valve sensor 200 of FIG. 10. First, second, and third seed layers are made of alumina ($Al_2O_3$), nickel-iron-chromium (NiFeCr), and nickel-iron (NiFe), respectively, from bottom to top; AFM layer 214 is made of platinum-manganese (PtMn) or alternatively of iridium-manganese (IrMn) or nickel-oxide (NiFe); AP pinned layers 210 and 212 are made of cobalt-iron (CoFe); APC layer 208 is made of ruthenium (Ru); first and second free layers 224 and 226 are made of cobalt-iron (CoFe) and nickel-iron (NiFe), respectively; spacer layer 202 is made of copper (Cu); and capping layer 234 is made of tantalum (Ta). A copper (Cu) layer may be located on second free layer 226 for reflecting conduction electrons back into the mean free path of conduction electrons. Thicknesses of particular materials may be 30 Angstroms of $Al_2O_3$ for first seed layer 218; 25 Angstroms of NiFeCr for second seed layer 220; 10 Angstroms of NiFe for third seed layer 222; 150 Angstroms of PtMn for AFM layer 214, various thicknesses X of $Co_{90}Fe_{10}$ for first AP pinned layer 210; 8 Angstroms of Ru for APC layer 208; various thicknesses Z of $Co_{90}Fe_{10}$ for second AP pinned layer 212; 20 Angstroms of Cu for spacer layer 202; 15 Angstroms of $Co_{90}Fe_{10}$ for first free layer 224; 15 Angstroms of $Ni_{83}Fe_{17}$ for second free layer 226; and 40 Angstroms of Ta for capping layer 234.

Figure 11:
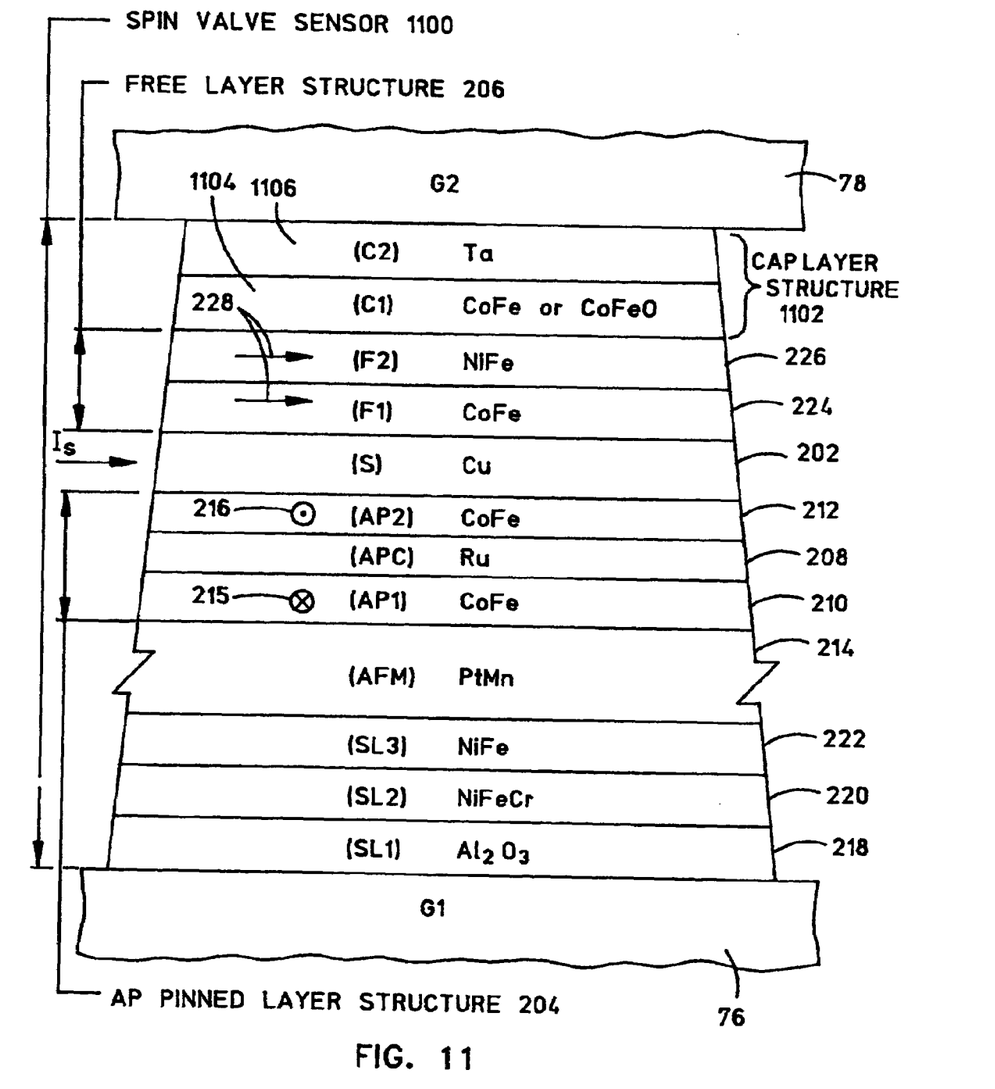
FIG. 11 is an ABS illustration of a first example of a multi-layer structure of a spin valve sensor having cobalt formed in a capping layer.

Capping Layer Structure Which Includes A Cobalt Layer. FIG. 11 shows an ABS illustration of a multi-layered structure of a spin valve sensor 1100 of a magnetic head. Spin valve sensor 1100 is similar to that shown and described in relation to FIG. 10; however, a capping layer structure 1102 of spin valve sensor 1100 has a layer 1104 which includes a cobalt (Co) alloy formed underneath a tantalum layer 1106. Specifically, layer 1104 of spin valve sensor 1100 includes cobalt-iron (CoFe) or cobalt-iron-oxide (CoFeO). It has been discovered that, with use of the specific materials in spin valve sensor 1100 as described, relatively thin layers of CoFe or CoFeO in capping layer structure 1102 enhances or increases the $\Delta r/R$ of spin valve sensor 1100. Preferably, the CoFe or CoFeO in capping layer structure 1102 may be formed to a thickness of between about 3–6 Angstroms. Tantalum layer 1106 may be formed to a thickness of between about 25–50 Angstroms. With use of capping layer structure 1102, the $\Delta r/R$ of spin valve sensor 1100 may be increased between 2–4% given a fixed free layer thickness.

Although the CoFe or CoFeO in capping layer structure 1102 increases spin valve sensor's 1100 $\Delta r/R$, the soft magnetic properties of spin valve sensor 1100 degrade as a result. Specifically, the CoFe or CoFeO in capping layer structure 1102 makes the magnetostriction of free layer structure 206 become near zero or positive when it is desirable for it to be slightly negative. CoFeO in capping layer structure 1102 also contributes to the moment of free layer structure 206, which makes it more difficult to balance thickness, GMR, and magnetostriction of spin valve sensor 200. However, since the use of CoFe or CoFeO in capping layer structure 1102 still has benefits (e.g. increased $\Delta r/R$), it may be suitable in some applications despite such concerns.

Figure 12:
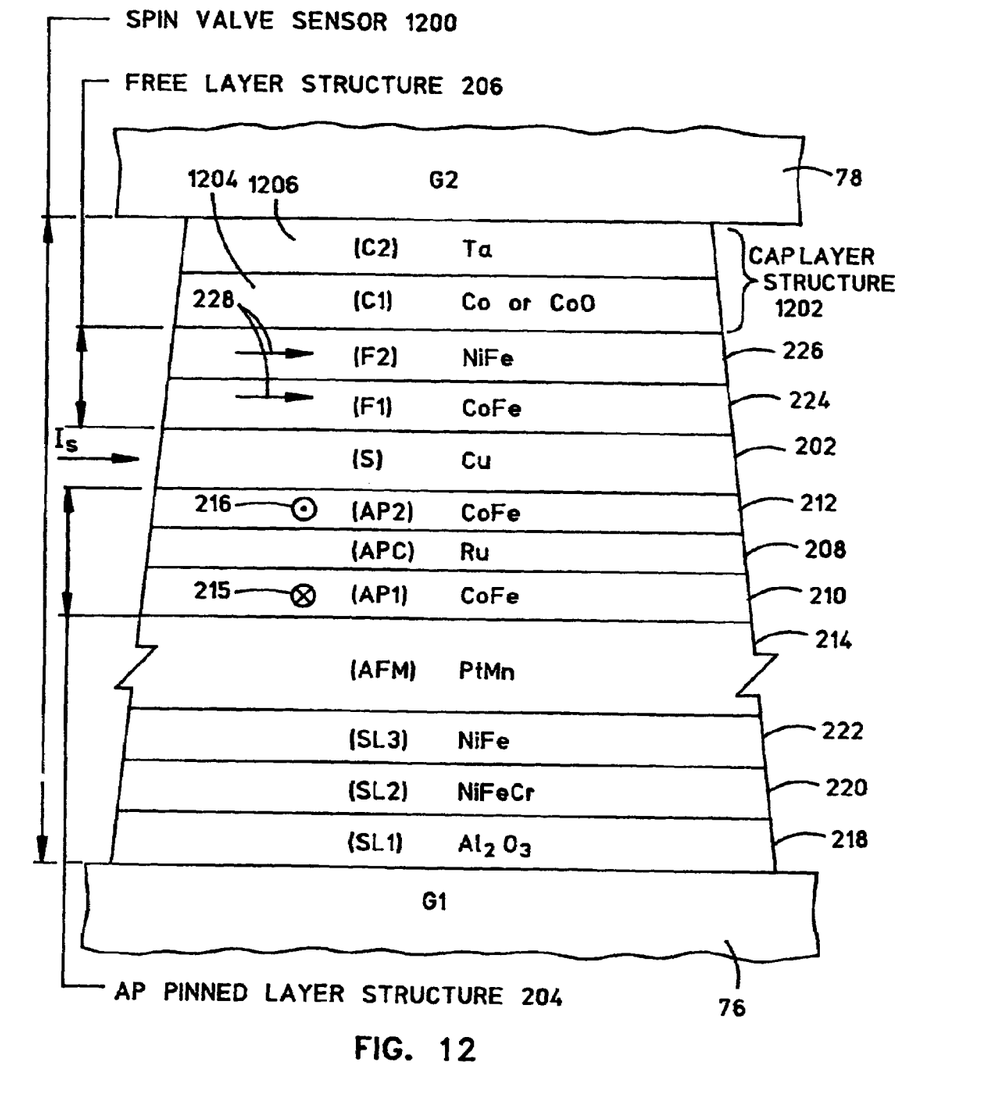
FIG. 12 is an ABS illustration of a second example of a multi-layer structure of a spin valve sensor having cobalt formed in the capping layer.

FIG. 12 shows an ABS illustration of another multi-layered structure of a spin valve sensor 1200 of a magnetic head. Spin valve sensor 1200 is also similar to that shown and described in relation to FIG. 10; however, a capping layer structure 1202 has a layer 1204 which includes cobalt (Co) formed underneath a tantalum layer 1206. Specifically, layer 1204 of spin valve sensor 1200 includes pure cobalt (Co) or oxidized cobalt (CoO). Preferably, layer 1204 is oxidized cobalt. It has been discovered that with se of the specific materials in spin valve sensor 1200 as described, relatively thin layers of Co or CoO in capping layer structure 1202 enhances or increases the $\Delta r/R$ of spin valve sensor 1200. Preferably, the Co or CoO in capping layer structure 1202 may be formed to a thickness of between about 2–6 Angstroms. Tantalum layer 1206 may be formed to a thickness of between about 25–50 Angstroms. With use of capping layer structure 1202, the $\Delta r/R$ of spin valve sensor 1200 may be increased between 3–6% given a fixed free layer thickness.

Unlike capping layer structure 1102 of FIG. 11, the soft magnetic properties of spin valve sensor 1200 do not degrade as a result of using the cobalt in capping layer structure 1202. The magnetostriction of free layer structure 1206 in FIG. 12 may be advantageously maintained in the desirable slightly-negative range. Also advantageously, CoO in capping layer structure 1202 does not contribute in any significant way to the moment of freelayer structure 206. Using the capping layer structure which includes cobalt, the free layer structure may be made relatively thin (e.g. total magnetic thickness less than 20 Angstroms or between 15–20 Angstroms) and/or the coercivity may be kept relatively low (e.g. less than 5 Oersteds or between 3–5 Oersteds).

Table 1 below provides measurement data for various properties of spin valve sensors with and without cobalt in the cap layer structure. In Table 1, $R_s$ is the resistance of the spin valve, $\Delta r/R$ is the magnetoresistive coefficient, $H_c$ is the coercivity of the free layer, $H_{ch}$ is the hard-axis coercivity, $H_f$ is the ferromagnetic coupling field, and λ is the magnetostriction coefficient. Columns 1–2 are data with use of ion beam deposition (IBD) techniques for the AFM layer (PtMn), whereas columns 3–5 are data with use of physical vapor deposition (PVD) for the AFM layer.

TABLE 1

Spin valve properties with and without CoO in the cap layer structure.

| Cap Layer Composition | Without CoO | With CoO (2 Å) | Without CoO | With CoO (2 Å) | With CoO (2 Å) |
|---|---|---|---|---|---|
| PtMn Deposition | IBD | IBD | PVD | PVD | PVD |
| AP layer 1 Composition | CoFe | CoFe | CoFe | CoFe | CoFe |
| AP layer 2 Composition | CoFe | CoFe | CoFe | CoFe | CoFe |
| Free Layer Composition | CoFe(14)/ NiFe(14) | CoFe(14.5)/ NiFe(14.5) | CoFe(14)/ NiFe(14) | CoFe(15)/ NiFe(14.5) | CoFe(9.5)/ NiFe(9) |
| Free Layer Thickness (Å) | 28 | 29 | 28 | 29.5 | 18.5 |
| Δr/R (%) | 12.42 | 13.2 | 12.93 | 13.17 | 11.5 |
| $R_s$ (Ω/sq.) | 24 | 23.6 | 24 | 23.8 | 26.5 |
| $H_c$ (Oe) | 4.2 | 4.4 | 4.8 | 4.5 | 4.2 |
| $H_{ch}$ (Oe) | 0.7 | 0.6 | 0.8 | 0.58 | 1 |
| $H_f$ (Oe) | −17 | −17.6 | −19 | −8 | −21 |
| λ (×10$^{-6}$) | −0.43 | −0.71 | −0.84 | −1.29 | −1.29 |

As apparent the Table 1 data, the Δr/R of a spin valve sensor having a CoO cap increases about 6%. The $H_c$ and $H_{ch}$ provided by an 18.5 Å thick free layer using the 2 Å CoO cap are as good as those provided by a 30 Å thick free layer without the CoO cap. Also, the CoO in the capping layer structure does not make the magnetostriction of the free layer positive.

Table 2 below provides additional measurement data for various properties of spin valve sensor 1200 of FIG. 12 where the thickness of CoO in cap layer structure 1202 is widely varied. In Table 2, $R_s$ is the resistance of the spin valve, Δr/R is the magnetoresitive coefficient, $H_e$ is the ferromagnetic coupling field, $H_e$ is the easy-axis coercivity. $H_{ch}$ is the hard-axis coercivity, and λ is the free layer magnetostriction coefficient.

TABLE 2

Sensor properties varying the thickness of CoO in the cap layer structure.

| CoO Cap Thickness (Å) | $R_s$ (Ω/sq.) | Δr/R (%) | $H_e$ (Oe) | $H_{ce}$ (Oe) | $H_{ch}$ (Oe) | Freelayer Thickness (Å) | λ (×10$^{-6}$) |
|---|---|---|---|---|---|---|---|
| 3 | 23.6 | 13.2 | −17.6 | 4.4 | 0.6 | 29.1 | −0.71 |
| 4 | 23.9 | 12.7 | −12.5 | 4.2 | 0.6 | 29.7 | −0.58 |
| 5 | 23.9 | 12.6 | −12.1 | 3.6 | 0.7 | 30.0 | −0.62 |
| 6 | 24.0 | 12.9 | −11.5 | 4.7 | 0.7 | 29.4 | −0.59 |

As apparent from Table 2, the properties of the spin valve structure are suitable even for a relatively thick layer of CoO (e.g. 6 Å) in the cap layer structure. Also, the cobalt film oxidizes and does not contribute to the freelayer moment even when the cobalt thickness is widely varied.

Figure 13:
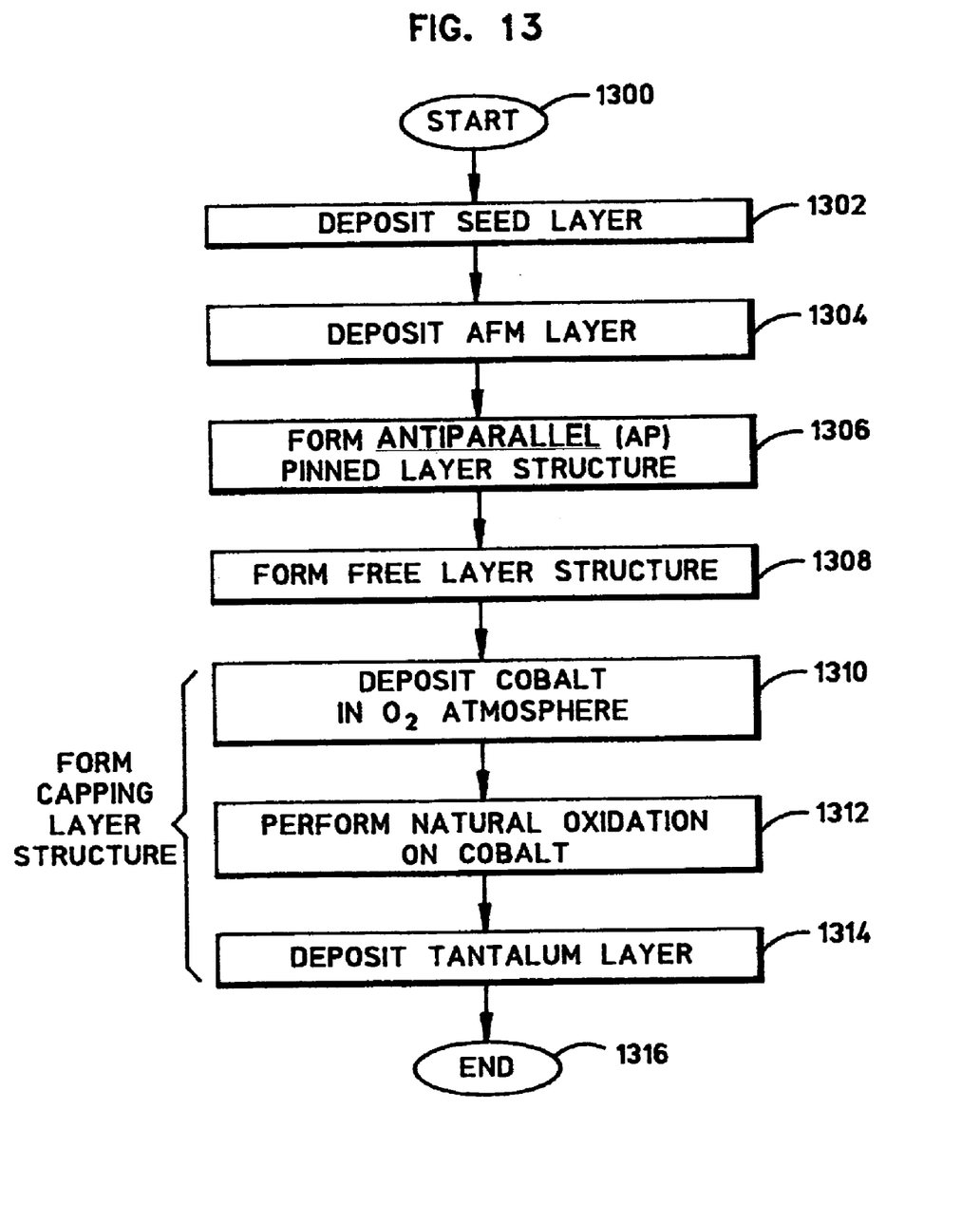
FIG. 13 is a flowchart which describes a method of making a spin valve sensor having cobalt formed in a capping layer.

FIG. 13 is a flowchart which describes a method of making a spin valve sensor of the type described in relation to FIGS. 11–12. Although the method described in relation to the flowchart of FIG. 13 relates to a bottom-pinned type spin valve, one skilled in the art will understand that it is applicable to top-pinned type spin valve as well as others.

Beginning at a start block 1300, a seed layer is deposited over a substrate (step 1302), such as over a dielectric gap layer of a magnetic head. In the present embodiment, the seed layer is a tri-layer seed layer of $Al_2O_3$, NiFeCr, and NiFe, from bottom to top. Next, an antiferromagnetic (AFM) layer (e.g. PtMn) is deposited over the seed layer (step 1304). An antiparallel (AP) pinned layer structure is then formed over the AFM layer (step 1306). The AP pinned layer structure includes first and second AP pinned layers (e.g. CoFe) which are separated by an antiparallel coupling (APC) layer (e.g. Ru). Next, a free layer structure is formed over the AP pinned layer structure (step 1308). The free layer structure may be a multi-layer structure, such as bilayer structure of CoFe and NiFe (separated from the AP pinned layer structure by a non-magnetic electrically conductive spacer layer). In the present application, all of these deposited layers including the AFM later, the AP pinned layer structure, and the free layer structure, may be referred to as a sensor stack structure.

In steps 1310–1314, a capping layer structure is formed over the sensor stack structure. In particular, cobalt is deposited in oxygen atmosphere over the free layer structure (step 1310). The cobalt may be deposited to a thickness of between about 2–6 Angstroms, for example. The partial pressure of the oxygen may be about $10^{-5}$ Torrs, for example. Next, the cobalt is subjected to a natural oxidation process (step 1312). This oxidation process may be performed for duration of between about 10–300 seconds and, in this particular embodiment, about 30 seconds. Next, a layer of tantalum is deposited over the oxidized cobalt. The tantalum may be deposited to a thickness of between about 25–50 Angstroms. The flowchart ends at an end block 1316, where subsequent processing steps to complete the manufacture of the magnetic head using conventional or other processes may be utilized. The result is a spin valve sensor of the type described in relation to FIG. 12, for example.

As described, a spin valve sensor of the present invention has a sensor stack structure which includes a free layer structure and an antiparallel (AP) pinned layer structure which are separated by a non-magnetic electrically conductive spacer layer. A capping layer structure formed over the sensor stack structure includes a layer of cobalt (e.g. pure cobalt, oxidized cobalt, or cobalt-iron) as well as a layer of tantalum formed over it. Preferably, the cobalt is oxidized. Advantageously, the cobalt layer in the capping layer structure enhances the GMR and soft magnetic properties for thinner freelayer structures. A method of forming the spin valve sensor includes the acts of forming a sensor stack structure which includes a free layer structure and an antiparallel (AP) pinned layer structure separated by a spacer layer; and forming, over the sensor stack structure, a capping layer structure which includes a cobalt layer.

A disk drive of the present invention may include a housing; a magnetic disk rotatably supported in the housing; a magnetic head assembly; a support mounted in the housing for supporting the magnetic head assembly so as to be in a transducing relationship with the magnetic disk; a spindle motor for rotating the magnetic disk; an actuator positioning means connected to the support for moving the magnetic head assembly to multiple positions with respect to said magnetic disk; a processor connected to the magnetic head assembly, to the spindle motor, and to the actuator for exchanging signals with the magnetic head assembly for controlling movement of the magnetic disk and for controlling the position of the magnetic head assembly; the magnetic head assembly including a read head; the read head including a spin valve sensor having a sensor stack structure which includes a free layer structure and an antiparallel (AP) pinned layer structure which are separated by a spacer layer; a capping layer structure formed over the sensor stack structure; wherein the capping layer structure comprises a cobalt layer.

Figure 14:
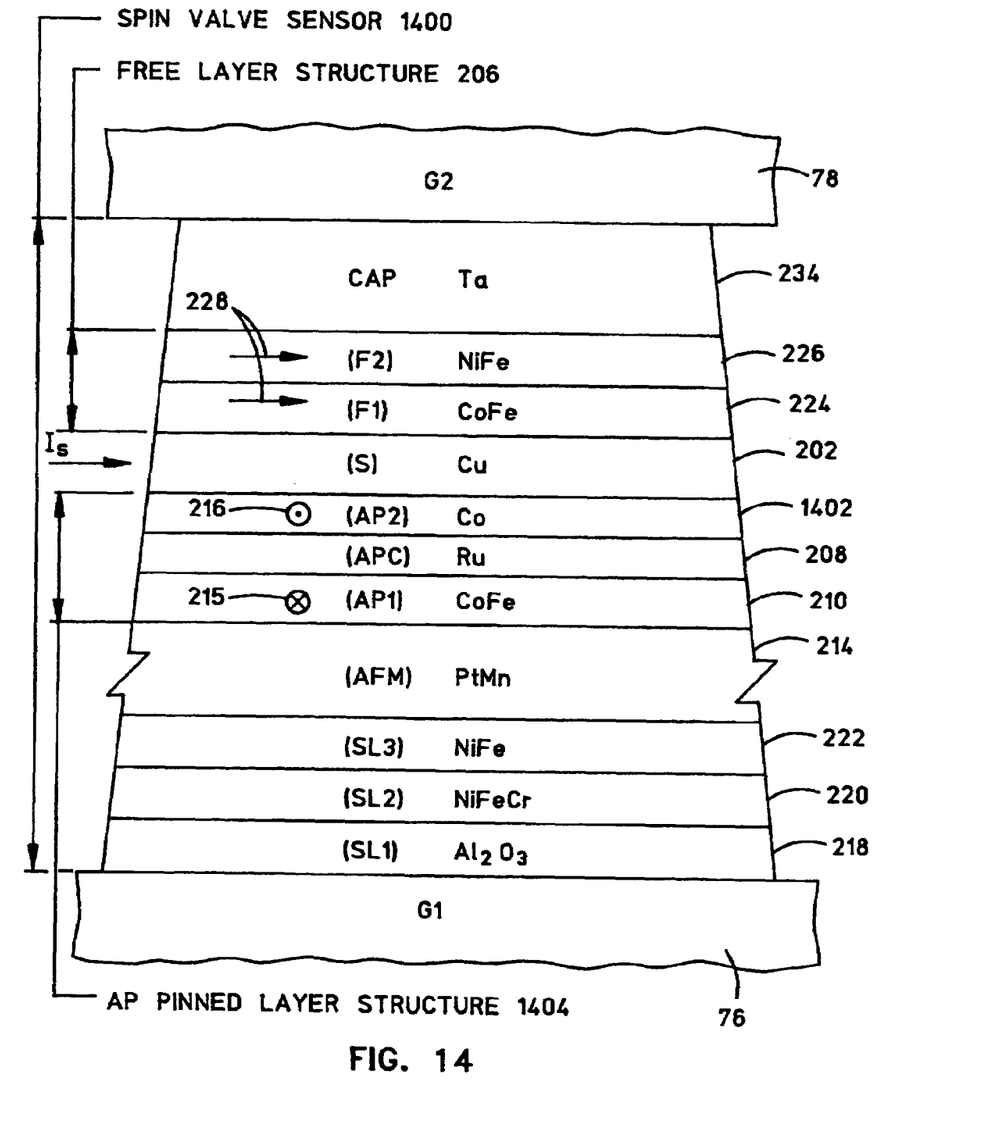
FIG. 14 is an ABS illustration of a first example of a multi-layer structure of a spin valve sensor with cobalt formed in a first AP pinned layer of an AP pinned layer structure.
Figure 15:
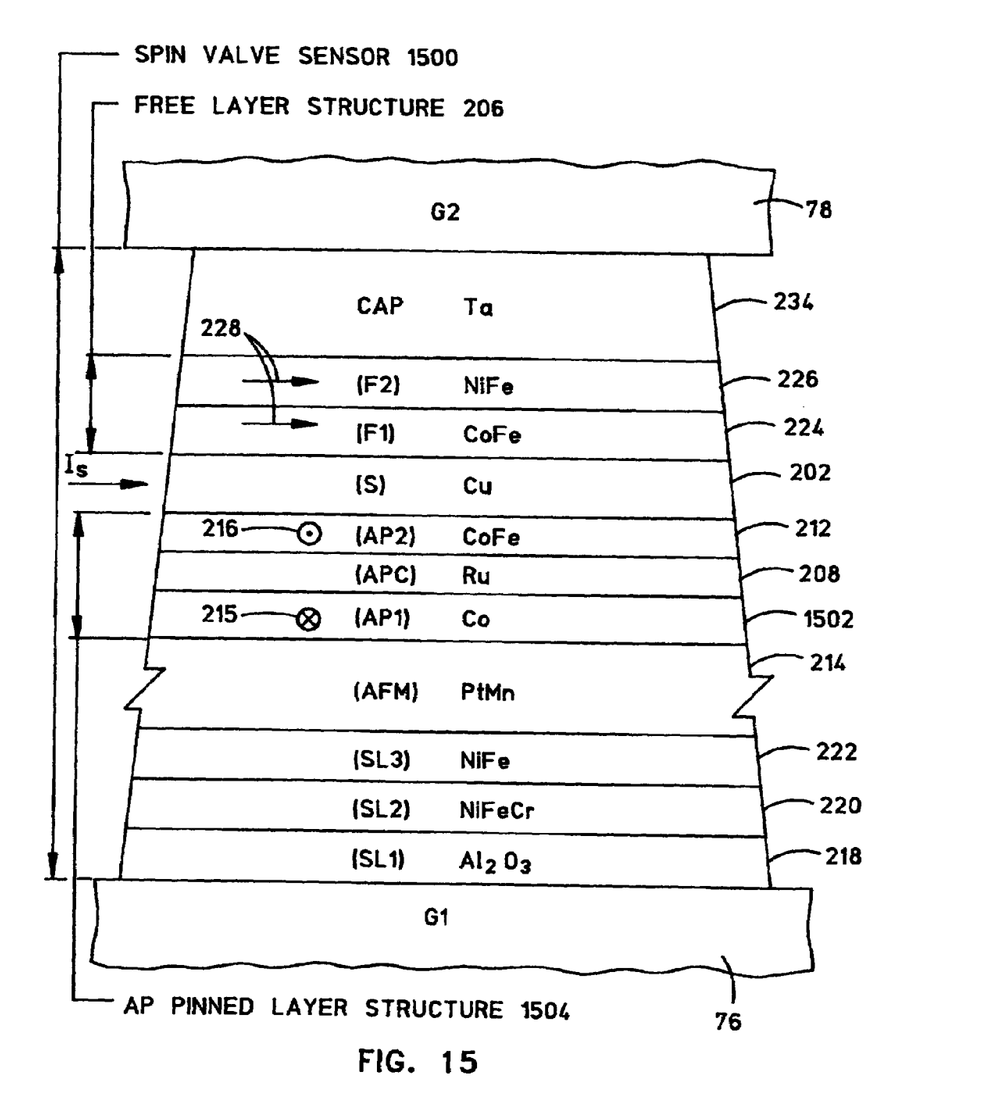
FIG. 15 is an ABS illustration of a second example of a multi-layer structure of a spin valve sensor with cobalt formed in a second AP pinned layer of the AP pinned layer structure.
Figure 16:
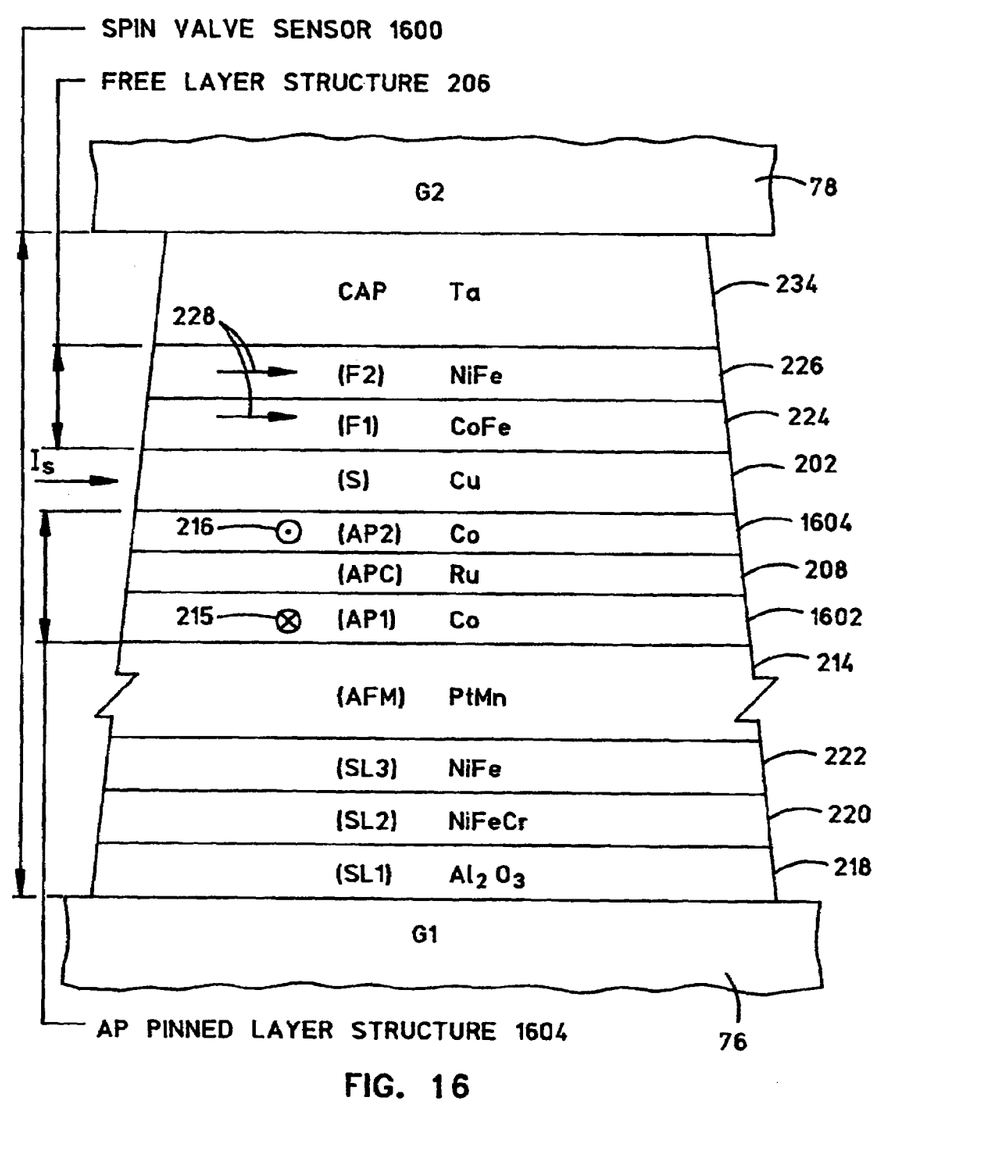
FIG. 16 is an ABS illustration of a third example of a multi-layer structure of a pin valve sensor with cobalt formed in the first and second AP pinned layers of the AP pinned layer structure.

Antiparallel (AP) Pinned Layer Structure Comprising A Cobalt Layer. FIGS. 14–16 show ABS illustrations of multi-layered structures of spin valve sensors 1400, 1500, 1600. Spin valve sensors 1400, 1500, and 1600 of FIGS. 14–16 are similar to that shown and described in relation to FIG. 10; however, at least one of the antiparallel (AP) pinned layers in the AP pinned layer structures includes cobalt (Co) in place of the cobalt-iron (CoFe) alloy. Preferably, the cobalt in the AP pinned layer(s) is pure cobalt without any iron content.

Spin valve sensor 1400 of FIG. 14 includes cobalt in a second AP pinned layer 1402 of an AP pinned layer structure 1404 but still utilizes cobalt-iron in first AP pinned layer 210. On the other hand, spin valve sensor 1500 of FIG. 15 includes cobalt in a first AP pinned layer 1502 of an AP pinned layer structure 1504 but still utilizes cobalt-iron in second AP pinned layer 212. Finally, spin valve sensor 1600 of FIG. 16 includes cobalt in both first and second AP pinned layers 1602 and 1604 of an AP pinned layer structure 1604. Note that, in each of the embodiments of FIGS. 14–16, cobalt-iron (not pure cobalt) and nickel-iron are utilized in free layer structure 206. Advantageously, the use of cobalt in at least one of the AP pinned layers increases the magnetoresistive coefficient $\Delta r/R$ of the sensor.

Table 3 below provides measurement data for properties of various spin valve sensors where cobalt is utilized in the AP pinned layer structure (e.g. spin valve sensors 1400, 1500, and 1600 of FIGS. 14–16). In Table 3, $R_s$ is the resistance of the spin valve, $\Delta r/R$ is the magnetic coefficient, $H_c$ is the coercivity of the free layer, $H_{ch}$ is the hard-axis coercivity, $H_f$ is the ferromagnetic coupling field, and $\lambda$ is the magnetostriction coefficient.

TABLE 3

Sensor properties with and without cobalt in the AP pinned layer structure.

| AFM Layer Composition & Thickness (Å) | PtMn 150 | PtMn 150 | PtMn 150 |
|---|---|---|---|
| AP Layer 1 | Co | CoFe | CoFe |

TABLE 3-continued

Sensor properties with and without cobalt in the AP pinned layer structure.

| Composition AP Layer 2 | Co | Co | CoFe |
|---|---|---|---|
| Composition Free Layer | CoFe/ | CoFe/ | CoFe/ |
| Composition Free Layer | NiFe | NiFe | NiFe |
| Free Layer Thickness (Å) | 29 | 29 | 28 |
| $\Delta r/R(\%)$ | 13.4 | 13.8 | 12.42 |
| $R_s(\Omega/sq.)$ | 22.5 | 22.5 | 24 |
| $H_c(Oe)$ | 8.68 | 4.8 | 4.2 |
| $H_{ch}(Oe)$ | 0.8 | 0.7 | 0.7 |
| $H_f(Oe)$ | −17 | −21 | −17 |
| $\lambda(\times 10^{-6})$ | −.08 | −0.71 | −0.43 |

As apparent, the use of cobalt in at least one of the AP pinned layer structures of a spin valve sensor enhances or increases the $\Delta r/R$. Preferably, cobalt is utilized in only one of the AP pinned layers and cobalt-iron is utilized in the other AP pinned layer, as provided in FIG. 3 and the Table 3 data. With use of cobalt in the AP pinned layer structure, the $\Delta r/R$ of spin valve sensor 1100 may be increased between 5–10% from spin valve sensor 200 of FIG. 10. Preferably, the thickness of Co varies between 10–30 Angstroms. Other properties of the spin valve sensor, such as its magnetostriction, remain suitable for the application. Note that, since the use of cobalt in the free layer structure results in relatively larger coercivity, cobalt-iron (not cobalt) is utilized in the free layer structure.

To construct a spin valve sensor of FIGS. 14–16, a sensor stack is formed which includes a free layer structure and an AP pinned layer structure separated by a non-magnetic electrically conductive spacer layer. The AP pinned layer structure is formed with a first AP pinned layer, a second AP pinned layer, and an APC layer between the first and second AP pinned layer. At least one of the first and the second AP pinned layers consists of cobalt and, preferably, only one of the AP pinned layers consists of cobalt and the other AP pinned layer comprises cobalt-iron. The layers are formed with the use of conventional deposition and etching techniques.

Figure 17:
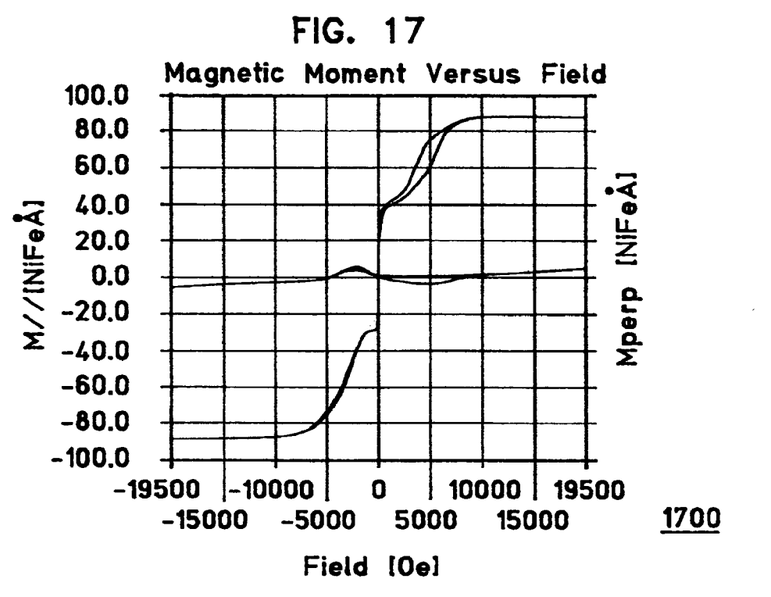
FIG. 17 is a graph which shows a magnetic moment as a function of an applied field strength of a spin valve sensor having cobalt in its AP pinned layer structure.
Figure 18:
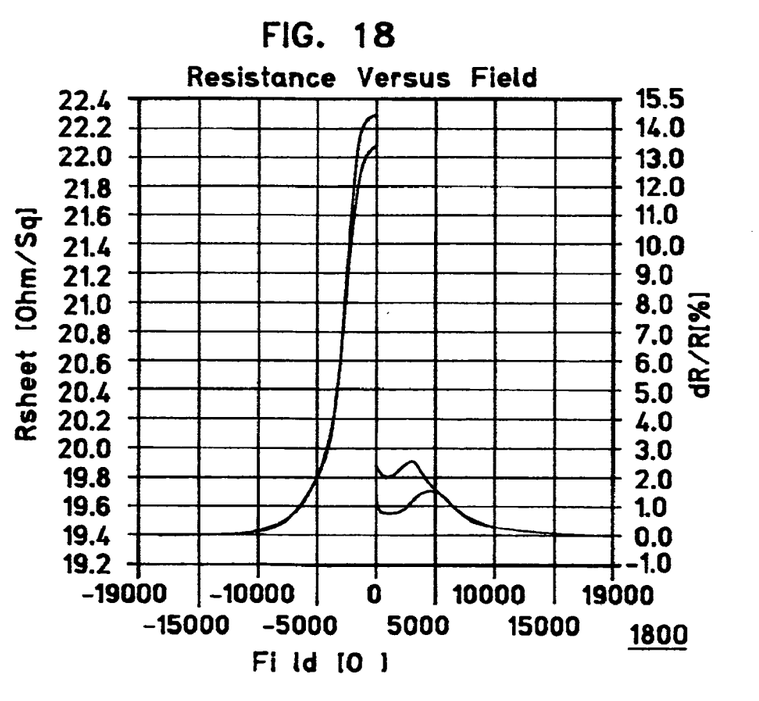
FIG. 18 is a graph which shows a resistance as a function of an applied field strength of a spin valve sensor having cobalt in its AP pinned layer structure.

FIG. 17 is a graph 1700 which shows the magnetic moment as a function of applied field strength of a spin valve sensor having cobalt in the AP pinned layer structure. In FIG. 18, a graph 1800 which shows the resistance as a function of applied field strength of a spin valve sensor having cobalt in the AP pinned layer structure is shown. Both graphs 1700 and 1800 of FIGS. 17 and 18 relate to a spin valve sensor having the cobalt in only a single AP pinned layer (the second AP pinned layer) where the AFM layer is platinum-manganese.

As described, a spin valve sensor (which may be a bottom-pinned type or top-pinned type) includes a free layer structure; an antiparallel (AP) pinned layer structure; and a non-magnetic electrically conductive spacer layer in between the free layer structure and the AP pinned layer structure. The AP pinned layer structure includes a first AP pinned layer; a second AP pinned layer; and an antiparallel coupling (APC) layer formed between the first and the second AP pinned layer. One of the first and the second AP pinned layers consist of cobalt and the other one includes cobalt-iron. The pure cobalt may be provided in the first AP pinned layer or the second AP pinned layer. The use of the cobalt in one of the AP pinned layers increases the $\Delta r/R$ of the spin valve sensor. Preferably, the use of the cobalt results in a Δr/R of the spin valve sensor being greater than 12% and a coercivity $H_c$ being less than 5 Oersteds. In a method to construct such a spin valve sensor, a stack structure is formed which includes a free layer structure and an antiparallel (AP) pinned layer structure separated by a non-magnetic electrically conductive spacer layer. The AP pinned layer structure is formed with a first AP pinned layer, a second AP pinned layer, and an antiparallel coupling (APC) layer between the first and the second AP pinned layers, wherein one of the AP pinned layers consists of cobalt and the other one includes cobalt-iron. The layers may be formed using conventional deposition and etching techniques.

A disk drive of the present invention includes a housing; a magnetic disk rotatably supported in the housing; a magnetic head assembly; a support mounted in the housing for supporting the magnetic head assembly so as to be in a transducing relationship with the magnetic disk; a spindle motor for rotating the magnetic disk; an actuator positioning means connected to the support for moving the magnetic head assembly to multiple positions with respect to said magnetic disk; and a processor connected to the magnetic head assembly, to the spindle motor, and to the actuator for exchanging signals with the magnetic head assembly for controlling movement of the magnetic disk and for controlling the position of the magnetic head assembly. The magnetic head assembly includes a read head having a spin valve sensor which includes an antiparallel (AP) pinned layer structure and the AP pinned layer structure. The AP pinned layer structure includes a first AP pinned layer; a second AP pinned layer; an antiparallel coupling (APC) layer formed between the first and the second AP pinned layer; wherein one of the AP pinned layers consists of cobalt and the other includes cobalt-iron.

It is to be understood that the above is merely a description of preferred embodiments of the invention and that various changes, alterations, and variations may be made without departing from the true spirit and scope of the invention as set for in the appended claims. Although the specific sensors described herein have been bottom-pinned type spin valves, one skilled in the art will understand that it is applicable to top-pinned type spin valves and others. Few if any of the terms or phrases in the specification and claims have been given any special meaning different from their plain language meaning, and therefore the specification is not to be used to define terms in an unduly narrow sense.

What is claimed is:

1. A spin valve sensor for a magnetic head, comprising:
   a free layer structure having a cobalt-iron layer;
   an antiparallel (AP) pinned layer structure;
   a non-magnetic electrically conductive spacer layer in between the free layer structure and the AP pinned layer structure;
   the AP pinned layer structure including;
      a first AP pinned layer;
      a second AP pinned layer;
      an antiparallel coupling (APC) layer formed between the first and the second AP pinned layers;
      one of the first and the second AP pinned layers consisting of cobalt and including no iron content;
      the other of the first and the second AP pinned layers comprising a cobalt-iron layer; and
   an antiferromagnetic (AFM) pinning layer for pinning the first AP pinned layer.

2. The spin valve sensor of claim 1, wherein a coercivity Hc of the spin valve sensor is less than 5 Oersteds.

3. The spin valve sensor of claim 1, wherein a Δr/R of the spin valve sensor is greater than 12%.

4. The spin valve sensor of claim 1, wherein the one AP pinned layer is the first AP pinned layer.

5. The spin valve sensor of claim 1, wherein the one AP pinned layer is the second AP pinned layer.

6. The spin valve-sensor of claim 1, wherein the free layer structure further comprises a nickel-iron layer.

7. The spin valve sensor of claim 1, wherein the AFM pinning layer comprises platinum-manganese (PtMn).

8. The spin valve sensor of claim 1, which is a bottom-pinned spin valve sensor wherein the AFM pinning layer is formed below the AP pinned layer structure.

9. A disk drive, comprising:
   a housing;
   a magnetic disk rotatably supported in that housing;
   a magnetic head assembly;
   a support mounted in the housing for supporting the magnetic head assembly so as to be in a transducing relationship with the magnetic disk;
   a processor connected to the magnetic head assembly, to the spindle motor, and to the actuator for exchanging signals with the magnetic head assembly for controlling movement of the magnetic disk and for controlling the position of the magnetic head assembly;
   the magnetic head assembly including a read head;
   the read head including a spin valve sensor;
   the spin valve sensor comprising:
      a free layer structure having a cobalt-iron layer;
      an antiparallel (AP) pinned layer structure;
      a non-magnetic electrically conductive spacer layer in between the free layer structure and the AP pinned layer structure;
   the AP pinned layer structure including:
      a first AP pinned layer;
      a second AP pinned layer;
      an antiparallel coupling (APC) layer formed between the first and the second AP pinned layer;
      one of the first and the second AP pinned layers consisting of cobalt and including no iron content;
      the other of the first and the second AP pinned layers comprising a cobalt-iron layer; and
   an antiferromagnetic (AFM) pinning layer for pinning the first AP pinned layer.

10. The disk drive of claim 9, wherein the one AP pinned layer is the first AP pinned layer.

11. The disk drive of claim 9, wherein the one AP pinned layer is the second AP pinned layer.

12. The disk drive of claim 9, wherein the free layer structure further comprises a nickel-iron layer.

13. The disk drive of claim 9, wherein the AFM pinning layer comprises platinum-manganese (PtMn).

14. The disk drive of claim 9, which is a bottom-pinned spin valve sensor wherein the AFM pinning layer is formed below the AP pinned layer structure.

15. The disk drive of claim 9, wherein a coercivity $H_c$ of the spin valve sensor is less that 5 Oersteds.

16. The disk drive of claim 9, wherein a Δr/R of the spin valve sensor is greater than 12%.

17. A method of making a spin valve sensor for a magnetic head, comprising:
   forming an antiparallel (AP) pinned layer structure and a free layer structure which are separated by a non-magnetic electrically conductive spacer layer;
   forming the AP pinned layer structure with a first AP pinned layer, a second AP pinned layer, an antiparallel coupling (APC) layer;

forming an antiferromagnetic (AFM) pinning layer for pinning the first AP pinned layer;

wherein the free layer structure has a cobalt-iron layer;

wherein one of the first and the second AP pinned layers consists of cobalt and includes no iron content; and wherein the other of the first and the second AP pinned layers comprises a cobalt-iron layer.

18. The method of claim 17, wherein the one AP pinned layer is the first AP pinned layer.

19. The method of claim 17, wherein the one AP pinned layer is the second AP pinned layer.

20. The method of claim 17, wherein the AFM pinning layer is formed below the AP pinned layer structure.

21. The method of claim 17, wherein the AFM pinning layer is formed above the AP pinned layer structure.

* * * * *